United States Patent
Freed et al.

(10) Patent No.: US 11,133,152 B2
(45) Date of Patent: Sep. 28, 2021

(54) METHODS AND APPARATUS FOR PERFORMING PROFILE METROLOGY ON SEMICONDUCTOR STRUCTURES

(71) Applicant: APPLIED MATERIALS, INC., Santa Clara, CA (US)

(72) Inventors: Regina Freed, Los Altos, CA (US); Russell Chin Yee Teo, San Jose, CA (US); Madhur Sachan, Belmont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/711,005

(22) Filed: Dec. 11, 2019

(65) Prior Publication Data

US 2020/0300618 A1 Sep. 24, 2020

Related U.S. Application Data

(60) Provisional application No. 62/821,547, filed on Mar. 21, 2019.

(51) Int. Cl.
*H01J 37/28* (2006.01)
*G01B 15/00* (2006.01)

(52) U.S. Cl.
CPC .............. *H01J 37/28* (2013.01); *G01B 15/00* (2013.01); *H01J 2237/2814* (2013.01)

(58) Field of Classification Search
CPC .... H01J 37/28; H01J 2237/2814; G01B 15/00
USPC .................. 250/306, 307, 309, 310, 311
See application file for complete search history.

(56) References Cited

U.S. PATENT DOCUMENTS

| | | |
|---|---|---|
| 6,566,897 B2 | 5/2003 | Lo et al. |
| 6,943,350 B2 | 9/2005 | Nasser-Ghodsi et al. |
| 8,785,879 B1 | 7/2014 | Frosien |
| 9,116,108 B1 | 8/2015 | Luoh et al. |
| 9,257,260 B2 | 2/2016 | Fan et al. |

(Continued)

OTHER PUBLICATIONS

Smart E-Beam for Defect Identification & Analysis in the Nanoscale Technology Nodes: Technical Perspectives; Ankush Oberai, and Jiann-Shiun Yuan, Synopsys, Mountain View, CA 94043, USA, Department of Electrical and Computer Engineering, University of Central Florida, Orlando, FL 32816, USA; Jiann-Shiun.Yuan@ucf.edu, Correspondence: Aoberai@Synopsys.com; Tel.: +1-408-888-3542, Received: Sep. 1, 2017; Accepted: Oct. 13, 2017; Published: Oct. 20, 2017.

(Continued)

*Primary Examiner* — Nicole M Ippolito
(74) *Attorney, Agent, or Firm* — Moser Taboada

(57) ABSTRACT

Methods and apparatus for inspecting features on a substrate including exposing at least a portion of the substrate to a first electron beam landing energy to obtain a first image; exposing the at least a portion of the substrate to a second electron beam landing energy to obtain a second image, wherein the second electron beam landing energy is different from the first electron beam landing energy; realigning the first image and the second image to a feature on the substrate; and determining from at least one measurement from the first image associated with the feature and at least one measurement from the second image associated with the feature if the feature is leaning or twisting.

20 Claims, 5 Drawing Sheets

(56) References Cited

U.S. PATENT DOCUMENTS

| | | |
|---|---|---|
| 9,267,903 B2 | 2/2016 | Park et al. |
| 9,601,303 B2 | 3/2017 | Frosien |
| 2015/0283801 A1* | 10/2015 | Mochizuki ............... B41J 2/325 |
| | | 347/110 |
| 2016/0035538 A1* | 2/2016 | Fukuda ................. H01J 37/285 |
| | | 250/307 |
| 2016/0370425 A1 | 12/2016 | Stallcup et al. |
| 2020/0057388 A1* | 2/2020 | Sun ....................... G03F 7/7065 |

OTHER PUBLICATIONS

Optimization of e-beam landing energy for EBDW Enden D. Liu, Ted Prescop* Multibeam Corporation, 1900 Wyatt Drive, Suite 15, Santa Clara, CA, USA 95054.

* cited by examiner

METHODS AND APPARATUS FOR PERFORMING PROFILE METROLOGY ON SEMICONDUCTOR STRUCTURES

CROSS-REFERENCE TO RELATED APPLICATIONS

This application claims benefit of U.S. provisional patent application Ser. No. 62/821,547, filed Mar. 21, 2019 which is herein incorporated by reference in its entirety.

FIELD

Embodiments of the present principles generally relate to semiconductor processing.

BACKGROUND

As semiconductor substrate processing moves towards increasingly smaller feature sizes and line-widths, the importance of masking, etching, and depositing material on a semiconductor substrate with greater precision increases. The increased precision also means that nano-sized flaws may cause catastrophic failures in a semiconductor structure. To detect these flaws, scanning electron microscopes (SEM) or transmission electron microscopes (TEM) have been traditionally used to inspect semiconductor structures. However, SEM and TEM inspection tools employ destructive testing which requires a portion of the wafer to be dissected and placed into the inspection tool. The destructive testing is also time consuming due to the need to cut apart the wafer in order to perform an inspection. The inventors have also observed that traditional semiconductor inspection technology is unlikely to be able to determine if a semiconductor structure has a flaw such as a lean or twist. Accordingly, the inventors have provided improved methods and apparatus for determining the lean and/or twist of semiconductor structures.

SUMMARY

Methods and apparatus for detecting lean and/or twist of features of semiconductor structures are provided herein.

In some embodiments, a method for inspecting a feature on a substrate may comprise exposing at least a portion of the substrate to a first electron beam landing energy to obtain a first image, exposing the at least a portion of the substrate to a second electron beam landing energy to obtain a second image, and processing the first image and the second image to allow contrasting of a feature on the substrate to expose defects.

In some embodiments, the method may further include processing the first image and the second image to realign the first image and the second image to the feature on the substrate, processing the first image and the second image to enhance grayscale gradients of at least one feature in the first image and in the second image, processing the first image and the second image to enhance contour edges of at least one feature in the first image and in the second image, determining if the feature is leaning based on at least one distance between the feature and another feature in the first image compared to the second image, determining if the feature is leaning based on at least one measurement of the feature in the first image compared to at least one measurement of the feature in the second image, determining if the feature is twisting based on at least one orientation measurement of the feature in the first image compared to at least one orientation measurement of the feature in the second image, selecting the first electron beam landing energy to be less than the second electron beam landing energy, wherein the first electron beam landing energy and the second electron beam landing energy are selected from a range of approximately 500 eV to approximately 300 keV, increasing a difference between the first electron beam landing energy and the second electron beam landing energy to detect twisting of the feature, exposing the substrate to more than two electron beam landing energies to obtain more than two images of the feature to enhance any defects, adjusting at least one electron beam landing energy based on a type of material being exposed by the at least one electron beam landing energy, and/or automatically adjusting the at least one electron landing beam energy based on the type of material.

In some embodiments, a method for inspecting a feature on a substrate may comprise exposing at least a portion of the substrate with an electron beam containing a first electron beam landing energy to obtain a first image and containing a second electron beam landing energy to obtain a second image, wherein the second electron beam landing energy is different from the first electron beam landing energy, realigning the first image and the second image to a feature on the substrate, and determining from at least one measurement from the first image associated with the feature and at least one measurement from the second image associated with the feature if the feature is leaning or twisting.

In some embodiments, the method may further include image processing the first image and the second image to enhance grayscale gradients of at least one feature in the first image and the at least one feature in the second image, image processing the first image and the second image to enhance contour edges of at least one feature in the first image and at least one feature in the second image, determining if the feature is leaning based on at least one distance between the feature and another feature in the first image compared to the second image or based on at least one measurement of the feature in the first image compared to at least one measurement of the feature in the second image, determining if the feature is twisting based on at least one orientation measurement of the feature in the first image compared to at least one orientation measurement of the feature in the second image, and/or wherein the first electron beam landing energy and the second electron beam landing energy are selected from a range of approximately 500 eV to approximately 300 keV.

In some embodiments, a non-transitory, computer readable medium may have instructions stored thereon that, when executed, cause a method for inspecting a feature on a substrate to be performed, the method may comprise exposing at least a portion of the substrate with an electron beam containing a first electron beam landing energy to obtain a first image and containing a second electron beam landing energy to obtain a second image, wherein the second electron beam landing energy is different from the first electron beam landing energy, realigning the first image and the second image to a feature on the substrate, and determining from at least one measurement from the first image associated with the feature and at least one measurement from the second image associated with the feature if the feature is leaning or twisting.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
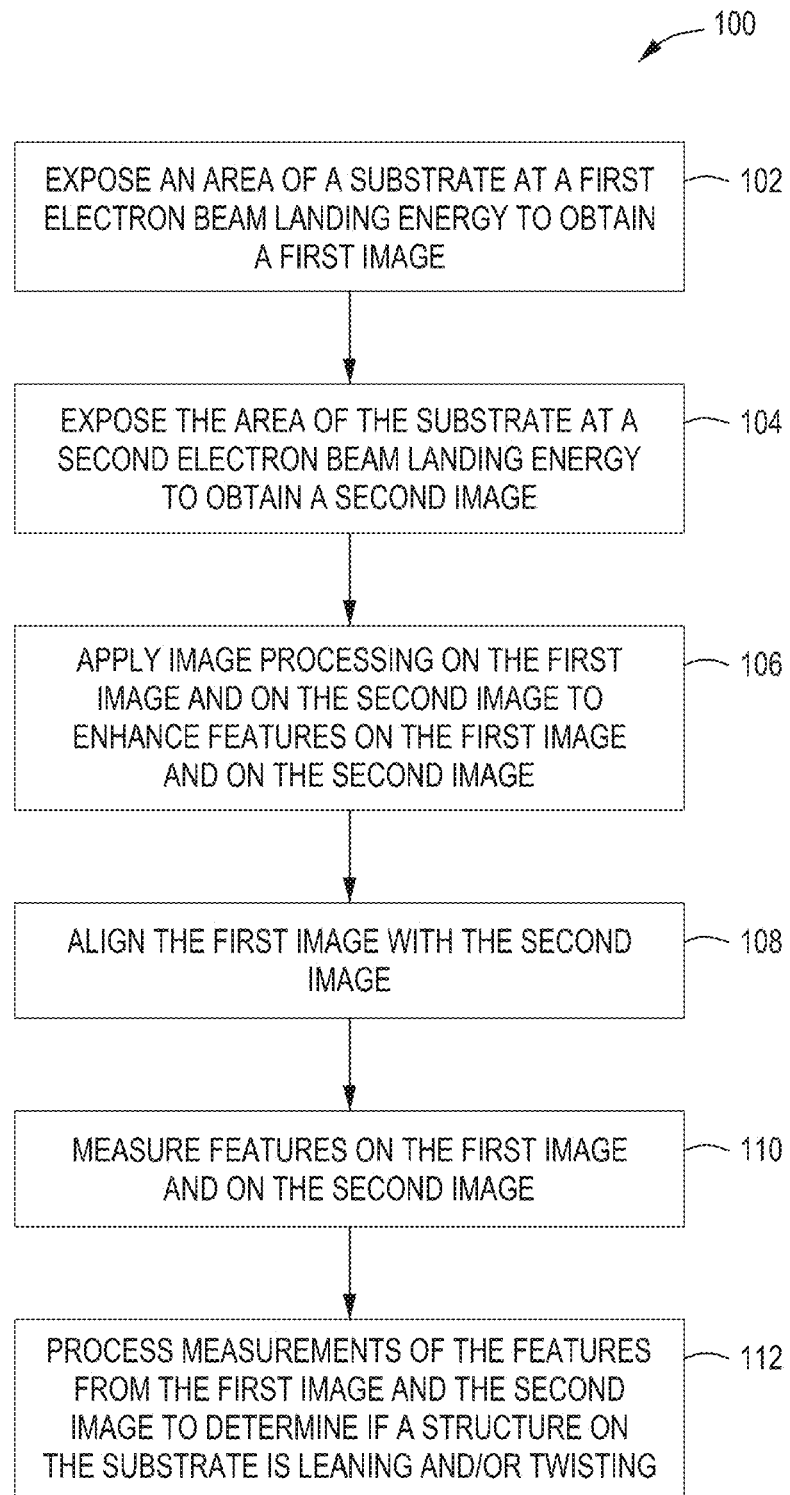
FIG. 1 is a method of detecting lean and/or twist of a feature of a semiconductor structure in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide a fast, non-destructive process to locate defects such as leaning and/or twisting of features of semiconductor structures. The features may include, for example, fins (finFET), spacers, pillars, etc. The speed and non-destructive nature provide a cost effective means for inspecting semiconductor structures. Top down electron beam (ebeam) imaging is leveraged to detect leaning and/or twisting by using different ebeam landing energies and imaging methods to obtain images at two or more heights of the feature such as the top of the feature and the bottom of the feature. Additional images at other heights may be obtained by varying the landing energies. Measurements of features on the images such as, for example, gap CD (critical dimension) and/or space CD at each landing energy may be utilized to determine the location of the part of the feature being imaged. Multiple data points may then be used to measure leaning and/or twisting of a feature.

Traditional processes such as SEM or TEM are slow and expensive, resulting in a limited amount of data collected in a given time period. SEM/TEM are also destructive in nature. In sharp contrast, the methods and apparatus of the present principles are non-destructive, fast, more cost effective, and have higher data sampling rates. The methods and apparatus may also use CD-SEM types of algorithms and exhibit CD-SEM types of throughputs. In some embodiments, images may also be obtained at different beam angles, focus points, and landing energies, or a subset, and use algorithms to reconstruct the profile. Algorithms associated with tomography may also be used to aid in processing the images from different beam angles.

The processes of the present principles may be used in conjunction with top down SEM semiconductor inspection tools such as, for example, PROVision™ or VeritySEM® inspection tools produced by Applied Materials, Inc. of Santa Clara, Calif. to detect leaning, twisting, and/or to enhance other processes. A feature is imaged under multiple conditions, including changing the landing energy of the electrons. When the electron energy is changed, the energy level determines how far the electrons penetrate into a sample. For example, in some embodiments, the process may start off with a lower landing energy which images towards the top of the feature because at lower landing energy levels the electrons will not go very deep into the feature. As the landing energy increases, the imaging goes deeper into the profile of the feature to allow imaging of the lower portion of the feature. By controlling the focus and the image quality, enough resolution is obtained to allow measuring of what a feature looks like at a different heights (different depths of electron penetration). The process then uses the fact that the image is changing as a function of depth to determine what the profile is of the feature that is being inspected. The profile of the feature could be changing or a feature could be bending or leaning—for example, the feature may be a consistent, box-like shape but may be bending over. In some embodiments, the process may increase landing energy differences for twisting measurements over leaning measurements. For leaning, a length (delta distance between images) in top down imaging doesn't have to be as great as for twisting. With twisting, a greater length (delta distance between images) allows a measurement over a longer part of the profile line for easier twisting detection.

The methods and apparatus of the present principles also provide a cost effective and non-destructive solution that may be used in conjunction with existing semiconductor process tooling in front-end of line (FEOL) and/or back-end of line (BEOL) manufacturing including memory and/or logic manufacturing. Another advantage of the methods and apparatus is that the processes are based on a single pass inspection for imaging of the features. In some embodiments, the processes may have electron beam landing energies that are adjusted based on the types of material being imaged to give the best image contrast and the like. The adjustments may be achieved through predetermined control recipes for the inspection tooling and/or automatically through automatic detection of substrate materials and the like.

In FIG. 1, a method 100 of detecting lean and/or twist of a feature of a semiconductor structure is shown. In block 102, an area of a substrate is exposed in situ at a first electron beam landing energy to obtain a first image. In block 104, the area of the substrate is exposed in situ at a second electron beam landing energy to obtain a second image. In some embodiments, the first image may be obtained by a first detector and the second image may be obtained by a second detector. For example, the first image and the second image may be obtained at the same time by using two different detectors at once, saving time and eliminating sensitivity adjustments of the detectors prior to capturing an image using different electron beam landing energies. Each detector may be set at a particular sensitivity bandwidth (e.g., low energy spectrum or high energy spectrum) for a given landing energy to obtain a desired image. In the example, the exposing of the area is accomplished using an electron beam having at least a first electron beam landing energy and at least a second electron beam landing energy contained within the electron beam. Each detector will then detect a specific landing beam energy, creating two different images from two different landing energies simultaneously.

In some embodiments, the second electron beam landing energy is different from the first electron beam landing energy. In some embodiments, the electron beam landing energy may be from approximately 500 eV to approximately 300 keV. In some embodiments, the electron beam landing energy may be from approximately 500 eV to approximately 200 keV. In some embodiments, the electron beam landing energy may be from 500 ev to 25 keV. In block 106, image processing is applied to the first image and the second image to enhance features on the first image and the second image. In some embodiments, different image processing may be applied to the first image than the image processing used to process the second image. In some embodiments, the image processing may include grayscale processing. In some embodiments, the image processing may include edge detection or contour processing.

In block 108, the first image is aligned with the second image. When different landing energies are used to obtain images, a shift in the features occurs. The alignment of the first image with the second image may be accomplished by using a common reference point such as a particular feature aspect location. By realigning, the subsequent feature measurements can be directly compared even though the obtained images may have shifted. In block 110, at least one feature is measured on the first image and the second image. In some embodiments, the measurement may be from the feature to another feature such as a gap or space between features. In some embodiments, the measurement may be of the feature such as a width and/or a length of a feature and the like. In block 112, the measurements of the features from the first image and the second image are processed to determine if a structure on the substrate is leaning and/or twisting. In some embodiments, leaning may be determined by detecting that a shift has occurred between a feature on the first image and the same feature on the second image. In some embodiments, twisting may be determined by detecting that a feature found in the first image has rotated in the second image.

Figure 2:
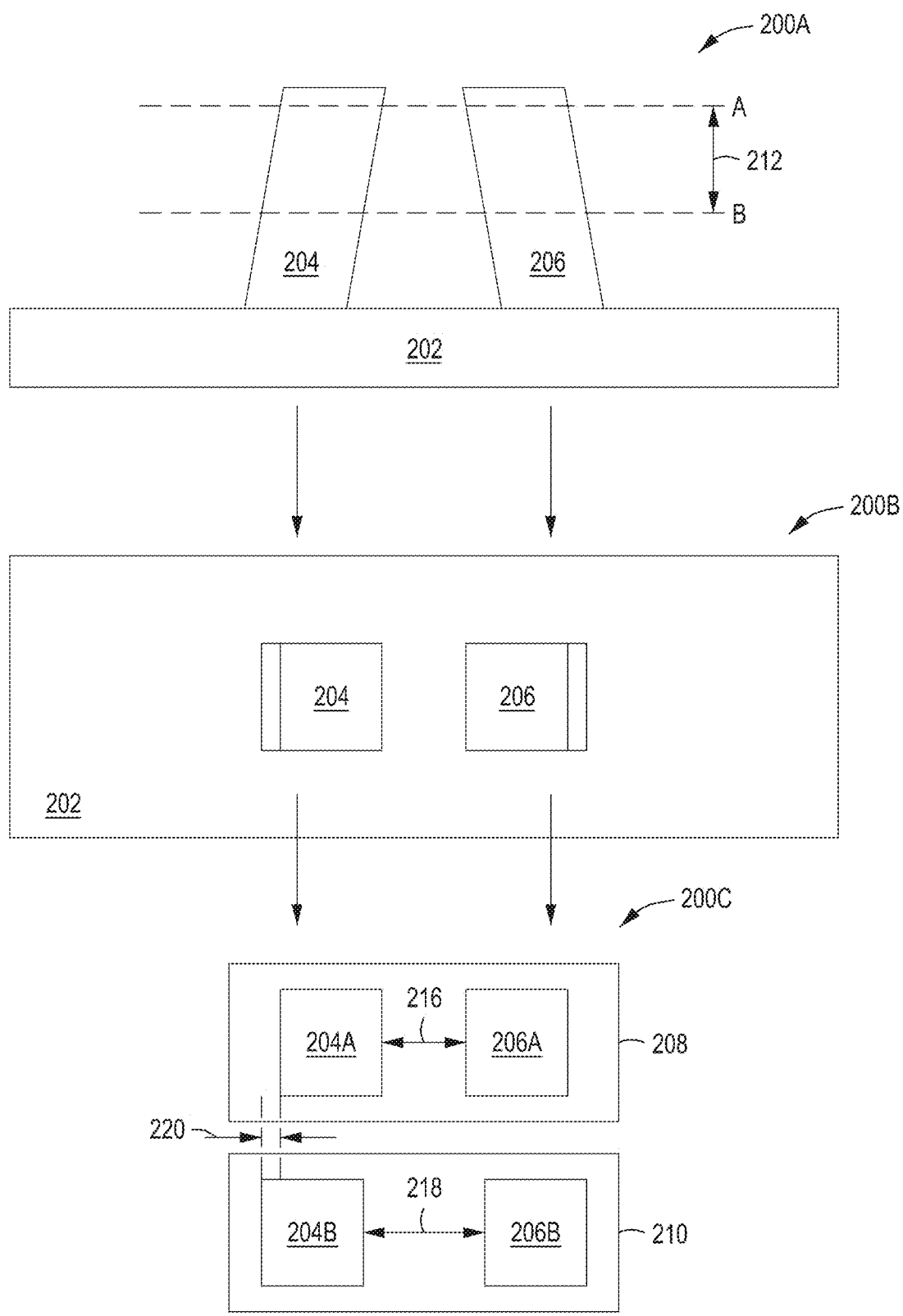
FIG. 2 illustrates a cross-sectional view and top views relating to detection of lean of a feature of a semiconductor structure in accordance with some embodiments of the present principles.

FIG. 2 illustrates a cross-sectional view 200A and top views 200B, 200C relating to detection of lean of a feature of a semiconductor structure. In cross-sectional view 200A, a first feature 204 and a second feature 206 are shown on a substrate 202. In the example illustration, the first feature 204 and second feature 206 are leaning towards each other. In top view 200B, the lean of the first feature 204 and the second feature 206 are shown from the top. An electron beam with a first landing energy is used to produce a first image 208 shown in top view 200C at a first height depicted by dashed line A in cross-sectional view 200A. An electron beam with a second landing energy is used to produce a second image 210 shown in top view 200C at a second height depicted by dashed line B in cross-sectional view 200A. In some embodiments, a distance 212 between the first and second height may be adjusted based on a height of a feature and/or type of material used for the feature. In some embodiments, more than two electron beam landing energies may be used to obtain more than two images.

The top view 200C shows the first image 208 and the second image 210 after the images have been realigned. In some embodiments, lean may be determined by measuring a distance 216 (gap or space) between the first feature 204A and the second feature 206A in the first image 208 and measuring a distance 218 (gap or space) between the first feature 204B and the second feature 206B in the second image 210. Differences between the two measurements may indicate that a lean is present in one or more of the features. In some embodiments, for example, the first feature 204A of the first image 208 may be directly compared to the first feature 204B of the second image 210. A shift 220 in an edge of the first feature 204 from the first image 208 to the second image 210 may indicate that the first feature 204 is leaning.

Figure 3:
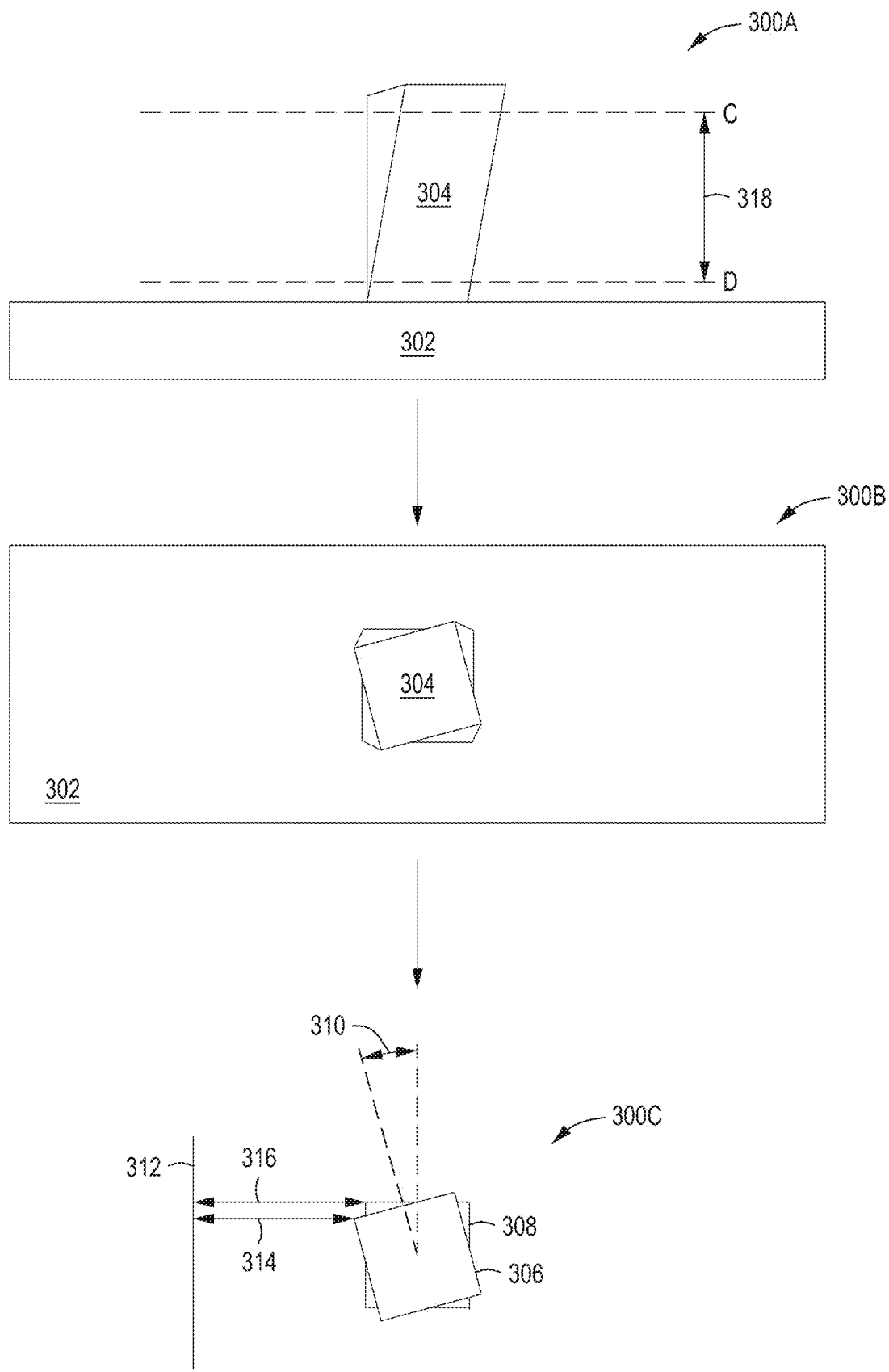
FIG. 3 illustrates a cross-sectional view and top views relating to detection of twist of a feature of a semiconductor structure in accordance with some embodiments of the present principles.

FIG. 3 illustrates a cross-sectional view 300A and top views 300B, 300C relating to detection of twist of a feature of a semiconductor structure. In cross-sectional view 300A, a feature 304 is shown on a substrate 302. In the example illustration, the feature 304 is twisted. In top view 300B, the twist of the feature 304 is shown from the top. An electron beam with a first landing energy is used to produce a first image 306 shown in top view 300C at a first height depicted by dashed line C in cross-sectional view 300A. An electron beam with a second landing energy is used to produce a second image 308 shown in top view 300C at a second height depicted by dashed line D in cross-sectional view 300A. In some embodiments, a distance 318 between the first and second height may be adjusted based on a height of a feature and/or type of material used for the feature. In some embodiments, more than two electron beam landing energies may be used to obtain more than two images.

The top view 300C shows the first image 306 and the second image 308 after the images have been realigned and placed on top of each other for ease of illustrating rotational changes (twisting). In some embodiments, the twisting may be determined by measuring an angle 310 created by a perpendicular line to an edge of the feature 304 in the first image 306 and a perpendicular line to an edge of the feature in the second image 308. In some embodiments, the twisting may be determined by measuring a common point of the feature 304 on the first image 306 and the second image 308 to another feature 312 to obtain a first distance 314 and a second distance 316. A difference in the first distance 314 and the second distance 316 (movement of the common point) may indicate twisting of the feature 304.

Figure 4:
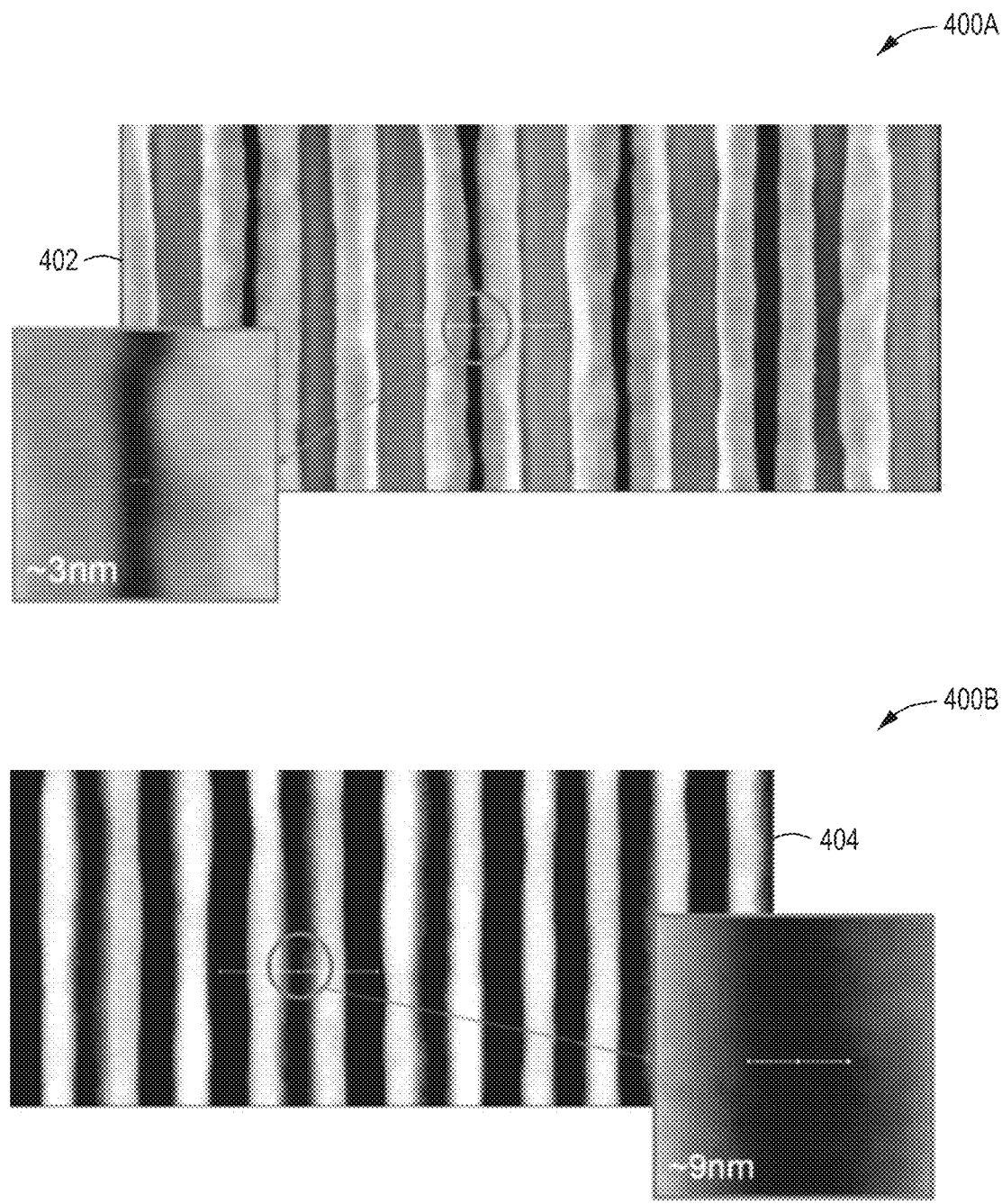
FIG. 4 depicts grayscale-based image processing for images obtained with different landing energies in accordance with some embodiments of the present principles.

FIG. 4 depicts grayscale-based image processing for images obtained with different landing energies. View 400A shows a first image 402 obtained with a first landing energy. View 400B shows a second image 404 obtained with a second landing energy. The first image 402 and the second image 404 were processed with a grayscale-based process to enhance the grayscale gradients in each image. The first image 402 and the second image 404 were realigned and measurements taken at the same feature point. For the example, the feature shown in the first image 402 has a gap of approximately 3 nm. The feature shown in the second image 404 has a gap of approximately 9 nm. The change in gap size may indicate that the feature has a significant lean defect.

Figure 5:
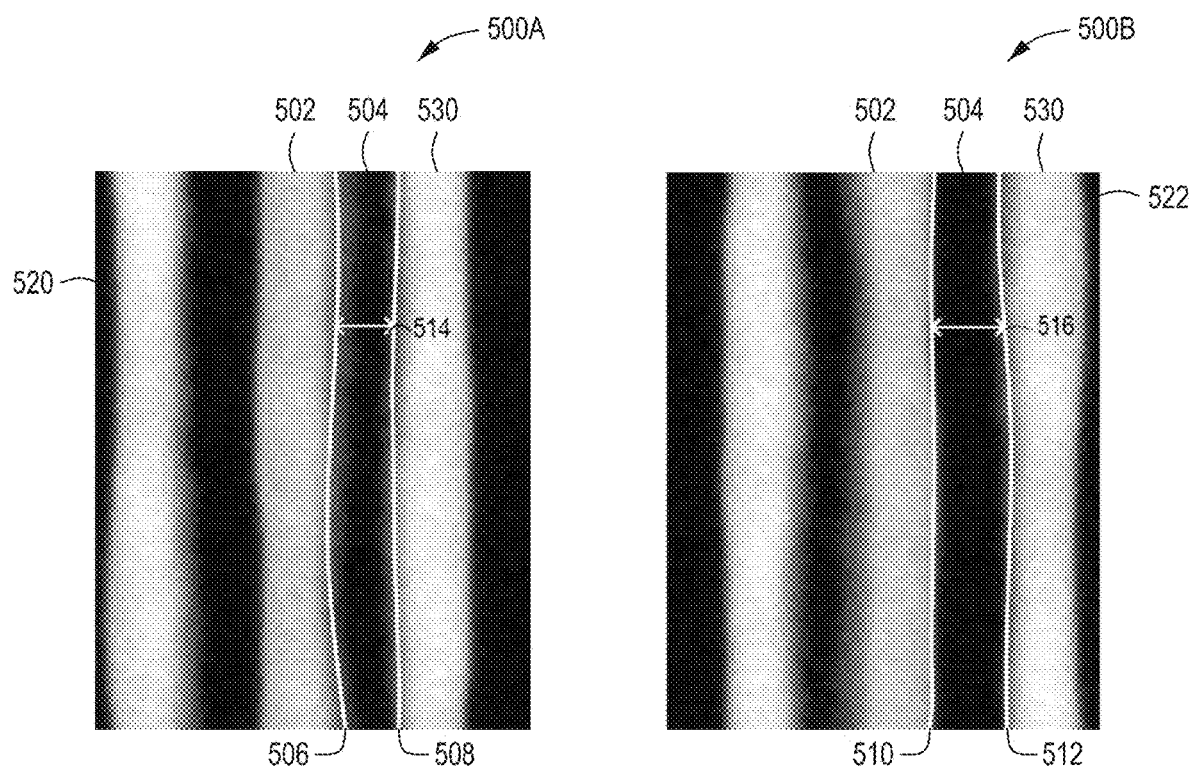
FIG. 5 depicts contour-based image processing for images obtained with different landing energies in accordance with some embodiments of the present principles.

FIG. 5 depicts contour-based image processing for images obtained with different landing energies. View 500A shows a first image 520 obtained with a first landing energy. View 500B shows a second image 522 obtained with a second landing energy. The first image 520 and the second image 522 were processed with a contour-based process to enhance the contours (edges) of the features. The first image 520 and the second image 522 were realigned such that a first feature 502 and gap 504 of the first image 520 are aligned with the first feature 502 and gap 504 of the second image 522. The first image 520 was obtained near the top of the features and after the contour-based image processing, contour lines 506, 508 of the first image 520 are compared to contour lines 510, 512 of the second image which was obtained near the bottom of the features. A distance 514 between the contour lines 506, 508 found in the first image 520 near the top of the features is less than a distance 516 between the contour lines 510, 512 found in the second image 522 near the bottom of the features, indicating a lean (narrowing of the gap between first feature 502 and feature 530) of the feature.

Figure 6:
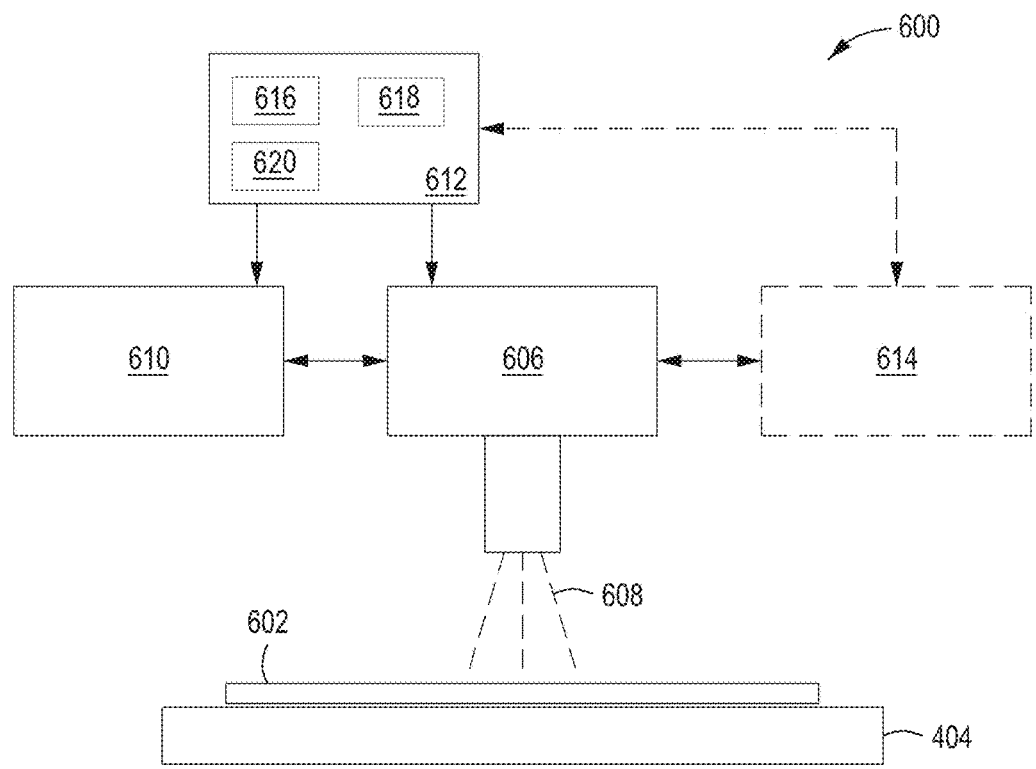
FIG. 6 is an apparatus for inspecting a substrate in accordance with some embodiments of the present principles.

FIG. 6 is an apparatus 600 for inspecting a substrate 602. The apparatus 600 includes a substrate holder 604 for receiving and positioning the substrate 602, an electron beam emitter 606 for generating an electron beam 608 towards the substrate holder 604 and consequently the substrate 602. The apparatus 600 also includes a first image detection system 610 that receives reflected electrons produced by the electron beam 608 after striking the substrate 602. The first image detection system 610 creates an image from the reflected electrons and performs various image processing on the image. A process controller 612 controls the operation of the apparatus 600 using a direct control or alternatively, by controlling computers (or controllers) associated with the apparatus 600.

In operation, the process controller 612 enables data collection and feedback from the apparatus 600 to optimize performance of the apparatus 600. The process controller 612 generally includes a Central Processing Unit (CPU) 616, a memory 618, and a support circuit 620. The CPU 616 may be any form of a general-purpose computer processor that can be used in an industrial setting. The support circuit 620 is conventionally coupled to the CPU 616 and may comprise a cache, clock circuits, input/output subsystems, power supplies, and the like. Software routines, such as a method as described above may be stored in the memory 618 and, when executed by the CPU 616, transform the CPU 616 into a specific purpose computer (process controller 612). The software routines may also be stored and/or executed by a second controller (not shown) that is located remotely from the apparatus 600.

The memory 618 is in the form of computer-readable storage media that contains instructions, when executed by the CPU 616, to facilitate the operation of the semiconductor processes and equipment. The instructions in the memory 618 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

The process controller 612 is in communication with the electron beam emitter 606 and the first image detection system 610 and is configured to expose at least a portion of the substrate to a first electron beam landing energy to obtain a first image with the first image detection system and to expose the at least a portion of the substrate to a second electron beam landing energy to obtain a second image with the first image detection system 610. In some embodiments, the second electron beam landing energy is different from the first electron beam landing energy. The process controller 612 is also configured to realign the first image and the second image to a feature on the substrate 602 with the first image detection system 610 and determine from at least one measurement from the first image associated with the feature and at least one measurement from the second image associated with the feature if the feature is leaning or twisting. In some embodiments, the image processing may be accomplished in the process controller 612 or in other internal components or in external components such as in a remote computing source and the like.

In some embodiments, an optional second image detection system 614 may be used in conjunction with the first image detection system 610 to obtain images at different levels of electron beam landing energies at the same time. The optional second image detection system 614 interacts with the process controller 612 similarly to the first image detection system 610. When the optional second image detection system 614 is used, the first image detection system 610 and the optional second image detection system 614 may be optimized by setting the first image detection system 610 and the optional second image detection system 614 to a particular sensitivity bandwidth. For example, the first image detection system 610 may be set to detect at a low energy spectrum level and the optional second image detection system 614 may be set to detect at a high energy spectrum level, allowing multiple images to be obtained from a single electron beam containing both levels of electron beam landing energies or from multiple electron beam emissions with different levels of electron beam landing energies. In some embodiments, more than two image detection systems may be utilized to obtain more than two images simultaneously.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for inspecting a feature on a substrate, comprising:
    exposing at least a portion of the substrate to a first electron beam landing energy to obtain a first image of a feature;
    exposing the at least a portion of the substrate to a second electron beam landing energy to obtain a second image of the feature; and
    processing the first image and the second image to allow contrasting of the feature on the substrate to expose defects of the feature.

2. The method of claim 1, further comprising:
    processing the first image and the second image to realign the first image and the second image to the feature on the substrate.

3. The method of claim 1, further comprising:
processing the first image and the second image to enhance grayscale gradients of at least one feature in the first image and in the second image.

4. The method of claim 1, further comprising:
processing the first image and the second image to enhance contour edges of at least one feature in the first image and in the second image.

5. The method of claim 1, further comprising:
determining if the feature is leaning based on at least one distance between the feature and another feature in the first image compared to the second image.

6. The method of claim 1, further comprising:
determining if the feature is leaning based on at least one measurement of the feature in the first image compared to at least one measurement of the feature in the second image.

7. The method of claim 1, further comprising:
determining if the feature is twisting based on at least one orientation measurement of the feature in the first image compared to at least one orientation measurement of the feature in the second image.

8. The method of claim 1, further comprising:
selecting the first electron beam landing energy to be less than the second electron beam landing energy.

9. The method of claim 1, wherein the first electron beam landing energy and the second electron beam landing energy are selected from a range of approximately 500 eV to approximately 300 keV.

10. The method of claim 1, further comprising:
increasing a difference between the first electron beam landing energy and the second electron beam landing energy to detect twisting of the feature.

11. The method of claim 1, further comprising:
exposing the substrate to more than two electron beam landing energies to obtain more than two images of the feature to enhance any defects.

12. The method of claim 1, further comprising:
adjusting at least one electron beam landing energy based on a type of material being exposed by the at least one electron beam landing energy.

13. The method of claim 12, further comprising:
automatically adjusting the at least one electron landing beam energy based on the type of material.

14. A method for inspecting a feature on a substrate, comprising:
exposing at least a portion of the substrate with an electron beam containing a first electron beam landing energy to obtain a first image of a feature and containing a second electron beam landing energy to obtain a second image of the feature, wherein the second electron beam landing energy is different from the first electron beam landing energy;
realigning the first image and the second image to the feature on the substrate; and
determining from at least one measurement from the first image associated with the feature and at least one measurement from the second image associated with the feature if the feature is leaning or twisting.

15. The method of claim 14, further comprising:
image processing the first image and the second image to enhance grayscale gradients of at least one feature in the first image and at least one feature in the second image.

16. The method of claim 14, further comprising:
image processing the first image and the second image to enhance contour edges of at least one feature in the first image and at least one feature in the second image.

17. The method of claim 14, further comprising:
determining if the feature is leaning based on at least one distance between the feature and another feature in the first image compared to the second image or based on at least one measurement of the feature in the first image compared to at least one measurement of the feature in the second image.

18. The method of claim 14, further comprising:
determining if the feature is twisting based on at least one orientation measurement of the feature in the first image compared to at least one orientation measurement of the feature in the second image.

19. The method of claim 14, wherein the first electron beam landing energy and the second electron beam landing energy are selected from a range of approximately 500 eV to approximately 300 keV.

20. A non-transitory, computer readable medium having instructions stored thereon that, when executed, cause a method for inspecting a feature on a substrate to be performed, the method comprising:
exposing at least a portion of the substrate with an electron beam containing a first electron beam landing energy to obtain a first image of a feature and containing a second electron beam landing energy to obtain a second image of the feature, wherein the second electron beam landing energy is different from the first electron beam landing energy;
realigning the first image and the second image to the feature on the substrate; and
determining from at least one measurement from the first image associated with the feature and at least one measurement from the second image associated with the feature if the feature is leaning or twisting.

* * * * *